(12) United States Patent
An

(10) Patent No.: US 12,379,396 B2
(45) Date of Patent: Aug. 5, 2025

(54) PROBE PIN

(71) Applicant: LUKEN Technologies, Yongin-si (KR)

(72) Inventor: Yun Tae An, Seongnam-si (KR)

(73) Assignee: LUKEN TECHNOLOGIES, Gyeonggi-Do (KR)

( * ) Notice: Subject to any disclaimer, the term of this patent is extended or adjusted under 35 U.S.C. 154(b) by 230 days.

(21) Appl. No.: 18/307,869

(22) Filed: Apr. 27, 2023

(65) Prior Publication Data

US 2024/0085456 A1 Mar. 14, 2024

(30) Foreign Application Priority Data

May 12, 2022 (KR) ........................ 10-2022-0058193

(51) Int. Cl.
*G01R 1/067* (2006.01)
(52) U.S. Cl.
CPC ..... *G01R 1/06722* (2013.01); *G01R 1/06705* (2013.01); *G01R 1/06733* (2013.01)
(58) Field of Classification Search
CPC ............ G01R 1/06722; G01R 1/06705; G01R 1/06733; G01R 1/06; G01R 1/067; G01R 1/06711; G01R 1/06716; G01R 1/06727; G01R 1/06738; G01R 1/06744; G01R 1/0675; G01R 1/06755; G01R 1/06761; G01R 1/06766; G01R 1/06772; G01R 1/06777; G01R 1/073; G01R 1/07307; G01R 1/07314; G01R 1/07321; G01R 1/07328; G01R 1/07335; G01R 1/07342; G01R 1/0735; G01R 1/07357; G01R 1/07364; G01R 1/07371; G01R 1/07378; G01R 1/07385; G01R 1/07392
See application file for complete search history.

(56) References Cited

U.S. PATENT DOCUMENTS 12,181,493 B2 * 12/2024 Wu et al. ........... G01R 1/06722
324/755.01
2013/0247375 A1 * 9/2013 Sato et al. ............. H05K 13/00
29/874
2015/0054540 A1 2/2015 Takahashi et al.

FOREIGN PATENT DOCUMENTS

CN 103238078 A 8/2013
KR 101034325 B1 5/2011
(Continued)

OTHER PUBLICATIONS

Office Action issued in a counterpart Taiwanese application No. 112143244, mailing date is Jun. 24, 2024, with machine translation.
(Continued)

*Primary Examiner* — Lee E Rodak
*Assistant Examiner* — Jeremiah J Barron
(74) *Attorney, Agent, or Firm* — HSML P. C.

(57) ABSTRACT

A probe pin for testing a target object, comprises a body portion of which a lower end is connected to a substrate and extends in a vertical direction and an upper end is to be in contact with a target object; and a housing provided to surround at least a part of the body portion and configured to support the body portion, wherein the body portion includes: a tip portion to be in contact with the target object; a spring portion extending from the tip portion and supplying an elastic force to the body portion in the vertical direction; and a connection portion extending from the spring portion and connected to the substrate.

6 Claims, 5 Drawing Sheets

(56) References Cited

FOREIGN PATENT DOCUMENTS

| KR | 20150020500 | A |   | 2/2015 |          |            |
|----|-------------|---|---|--------|----------|------------|
| KR | 20180095315 | A | * | 8/2018 | ............ | G01R 1/06738 |
| KR | 102132232   | B1 | * | 5/2019 | ............ | G01R 1/06722 |
| KR | 102147699   | B1 | * | 8/2020 | ............ | G01R 1/06744 |
| KR | 20230020780 | A | * | 2/2023 | ............ | G01R 1/06716 |
| TW | 201118382   | A |   | 6/2011 |          |            |

OTHER PUBLICATIONS

Office Action issued in a counterpart Korean application No. 10-2022-0058193, mailing date is Jul. 15, 2024, with machine translation.

\* cited by examiner

PROBE PIN

CROSS-REFERENCE TO RELATED APPLICATION

This application claims the benefit under 35 USC 119(a) of Korean Patent Applications No. 10-2022-0058193 filed on May 12, 2022 in the Korean Intellectual Property Office, the entire disclosures of which are incorporated herein by reference for all purposes.

TECHNICAL FIELD

The present disclosure relates to a probe pin for testing a target object.

BACKGROUND

A probe card is a device that connects a semiconductor chip (target object) and a test equipment to test operations of a semiconductor. A probe pin provided in the probe card is to be in contact with a chip pad of a wafer, sends an electrical signal and screens a defective semiconductor chip according to a returning signal.

The probe pin includes an elastic portion that can absorb a shock caused by a load generated when the probe pin is in contact with the chip pad of the wafer in order to suppress damage to the chip pad of the wafer due to the shock caused by the load.

Recently, as the size of semiconductor device decreases, the size of semiconductor chip pads and the pitch between the pads decrease. Accordingly, probe pins suitable for such fine pitches are required. Therefore, probe pins are being manufactured to have a small thickness.

However, in a probe pin according to a conventional technology, as the thickness decreases, an elastic portion decreases in elasticity and the probe pin is deformed in shape. Thus, a tip portion of the probe pin cannot be in stable contact with a chip pad of a wafer and is quickly worn away. Therefore, the probe pin needs to be replaced frequently.

PRIOR ART DOCUMENT

Patent Document

Korean Patent No. 10-1034325 (registered on May 3, 2011)

SUMMARY

In view of the foregoing, the present disclosure provides a probe pin that is suitable for fine pitches of a semiconductor chip pad and can be deformed to a minimum extent and thus can be increased in life.

However, the problems to be solved by the present disclosure are not limited to the above-described problems. Although not described herein, other problems to be solved by the present disclosure can be clearly understood by a person with ordinary skill in the art from the following descriptions.

A probe pin for testing a target object according to an embodiment of the present invention, comprises a body portion of which a lower end is connected to a substrate and extends in a vertical direction and an upper end is to be in contact with a target object; and a housing provided to surround at least a part of the body portion and configured to support the body portion, wherein the body portion includes: a tip portion to be in contact with the target object; a spring portion extending from the tip portion and supplying an elastic force to the body portion in the vertical direction; and a connection portion extending from the spring portion and connected to the substrate.

The body portion further includes: an upper protrusion provided on a side surface of the tip portion and protruding toward the housing; and a lower protrusion provided on a side surface of the connection portion and protruding toward the housing.

The housing includes: an upper opening that accommodates the upper protrusion; and a lower opening that accommodates the lower protrusion.

The upper opening is greater in length in a longitudinal direction of the probe pin than the upper protrusion, and the lower opening is greater in length in the longitudinal direction of the probe pin than the lower protrusion.

The upper opening is greater in length than the lower opening.

The housing further includes: a plurality of through-slits formed in at least one surface thereof.

The tip portion includes: a contact surface provided on its upper surface, and the contact surface has a shape of a plurality of triangular prisms and base sides of the plurality of triangular prisms extend from a side surface of the tip portion.

The spring portion includes: a first spring extending from a lower surface of the tip portion; a second spring extending from the lower surface of the tip portion and spaced apart from the first spring; and a separation wall provided between the first spring and the second spring.

The separation wall is smaller in length in a longitudinal direction of the probe pin than the first spring or the second spring before the first spring or the second spring is deformed.

Before the first spring or the second spring is deformed, an end of the separation wall is spaced apart from an upper surface of the connection portion.

According to the present disclosure, there are following effects.

A probe pin according to the present disclosure can be increased in life by minimizing deformation of an elastic portion caused by a load.

Also, a tip portion of the probe pin according to the present disclosure can minimize a decrease in contact efficiency caused by contaminants on a semiconductor chip pad and wear caused by contact.

However, the effects of the present disclosure are not limited to the above-described problems. Although not described herein, other effects can be clearly understood by a person with ordinary skill in the art from the following descriptions.

BRIEF DESCRIPTION OF THE DRAWINGS

In the detailed description that follows, embodiments are described as illustrations only since various changes and modifications will become apparent to a person with ordinary skill in the art from the following detailed description. The use of the same reference numbers in different figures indicates similar or identical items.

DETAILED DESCRIPTION

Figure 1:
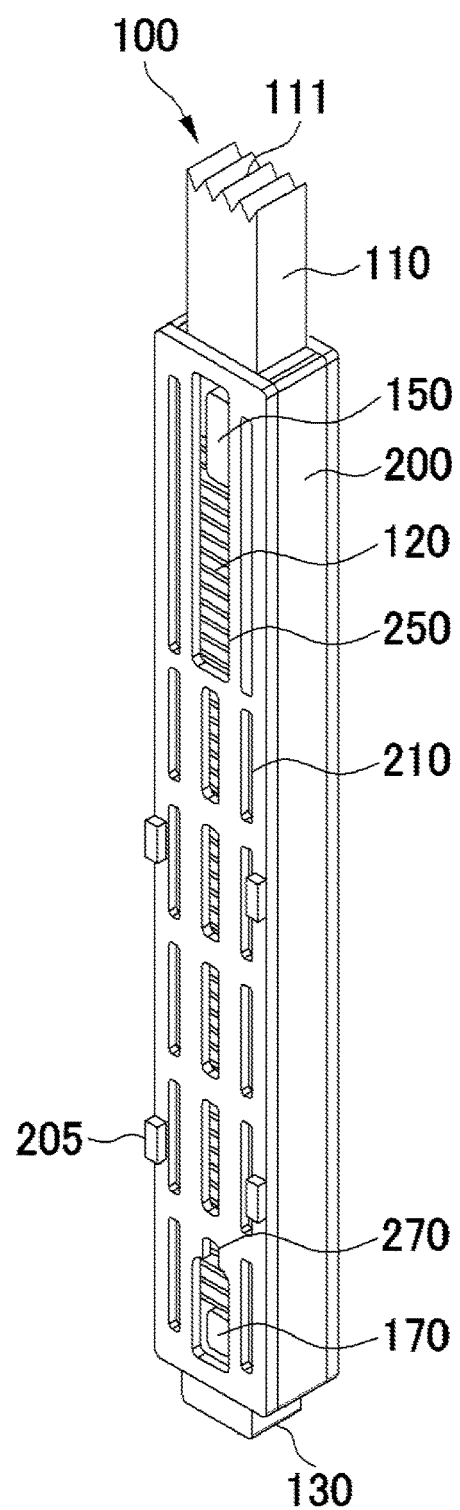
FIG. 1 is a perspective view of a probe pin according to an embodiment of the present disclosure.

Hereafter, example embodiments will be described in detail with reference to the accompanying drawings so that the present disclosure may be readily implemented by those skilled in the art. However, it is to be noted that the present disclosure is not limited to the example embodiments but can be embodied in various other ways. In the drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element. Further, it is to be understood that the term "comprises or includes" and/or "comprising or including" used in the document means that one or more other components, steps, operation and/or existence or addition of elements are not excluded in addition to the described components, steps, operation and/or elements unless context dictates otherwise and is not intended to preclude the possibility that one or more other features, numbers, steps, operations, components, parts, or combinations thereof may exist or may be added. Through the whole document, the term "on" that is used to designate a position of one element with respect to another element includes both a case that the one element is adjacent to the other element and a case that any other element exists between these two elements. Also, the terms "first" and "second" used herein may be used to describe diverse components regardless of their sequence and/or importance and are used merely to distinguish one component from the others, but the components are not limited by the terms. These terms do not necessarily refer to different components. For example, the terms "first direction" and "second direction" may refer to the same direction or may refer to different directions.

The present disclosure relates to a probe pin for testing a target object. A probe pin according to an embodiment of the present disclosure includes a body portion of which a lower end is connected to a substrate and extends in a vertical direction and an upper end is to be in contact with a target object, and a housing provided to surround at least a part of the body portion and configured to support the body portion. The body portion includes a tip portion to be in contact with the target object, a spring portion extending from the tip portion and supplying an elastic force to the body portion in the vertical direction, and a connection portion extending from the spring portion and connected to the substrate. Herein, if the target object is a semiconductor, the substrate connected to the probe pin may be a multi-layer ceramic (MLC) substrate equipped in a probe card, and if the target object is a display panel (for example, LCD, OLED, etc.), the substrate may be a printed circuit board (PCB) or a flexible printed circuit board (FPCB) equipped in a probe unit or a probe block. The probe pin according to the present disclosure can be manufactured through a micro-electro mechanical systems (MEMS) process.

Figure 2:
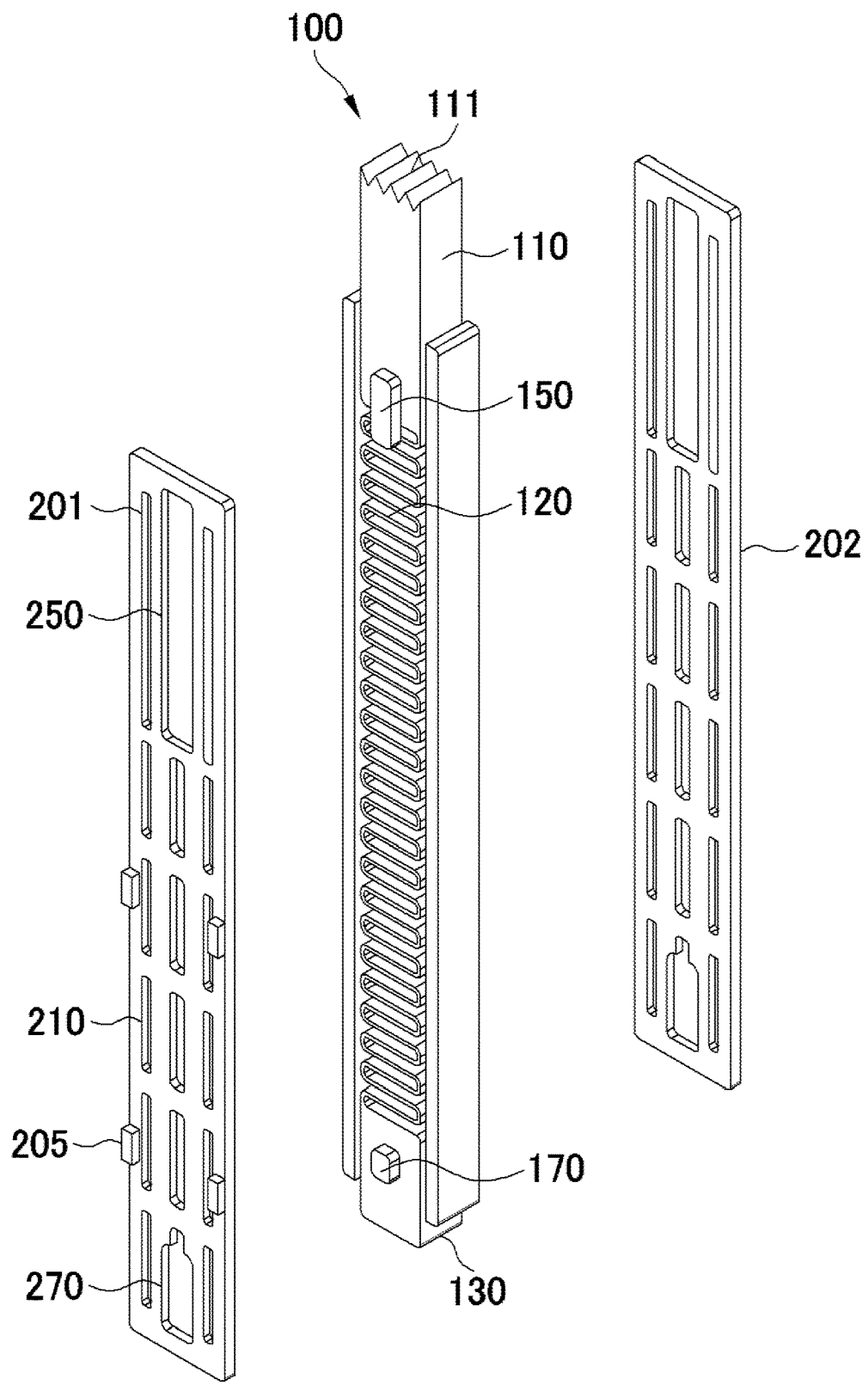
FIG. 2 is an exploded perspective view illustrating a structure of a body portion of the probe pin according to an embodiment of the present disclosure.

FIG. 1 is a perspective view of a probe pin 10 according to an embodiment of the present disclosure. FIG. 2 is an exploded perspective view illustrating a structure of a body portion 100 of the probe pin 10 according to an embodiment of the present disclosure.

Hereinafter, the structure of the probe pin 10 according to an embodiment of the present disclosure will be described with reference to FIG. 1 and FIG. 2.

As shown in FIG. 1, the probe pin 10 according to an embodiment of the present disclosure may include the body portion 100 and a housing 200 surrounding at least a part of the body portion 100.

The body portion 100 may have a rod shape extending in a vertical direction. A lower end of the body portion 100 may be connected to a substrate and an upper end may be in contact with a target object. The body portion 100 may include a tip portion 110 to be in contact with the target object, a spring portion 120 extending from the tip portion 110 and supplying an elastic force to the body portion 100 in the vertical direction, and a connection portion 130 extending from the spring portion 120 and connected to the substrate. That is, the body portion 100 may be formed as a single body including the tip portion 110, the spring portion 120, and the connection portion 130.

The housing 200 may have a quadrangular pillar shape surrounding at least a part of the body portion 100. In an embodiment, the housing 200 may be provided to surround the entire spring portion 120 and parts of the tip portion 110 and the connection portion 130. That is, at least parts of the tip portion 110 and the connection portion 130 of the body portion 100 may not be covered by the housing 200, but may be exposed. In an embodiment, the housing 200 may include a first surface 201 and a second surface 202 provided to face the first surface 201.

Further, the housing 200 may include a plurality of through-slits 210 formed in at least one surface thereof. In an embodiment, the plurality of through-slits 210 may be formed in each of the first surface 201 and the second surface 202 of the housing 200. Since the plurality of through-slits 210 is formed in at least one surface of the housing 200, a contact area between the spring portion 120 and the housing 200 is reduced when the spring portion 120 of the body portion 100 is contracted. Therefore, it is possible to minimize wear caused by contact between the spring portion 120 and the housing 200. Furthermore, whether the spring portion 120 is defective or not can be checked through the through-slits 210, and the mobility of the spring portion 120 can be secured as compared to an inner space of the housing 200. Therefore, it is possible to minimize the size of the housing 200 so as to be suitable for fine pitches of a semiconductor chip pad.

In an embodiment, the housing 200 may further include a coupling portion 205 provided on an outer surface of the housing 200. As shown in FIG. 1 and FIG. 2, the coupling portion 205 may protrude outwards from an outer side of the first surface 201 of the housing 200. The coupling portion 205 is provided to fix the housing 200 to a guide plate. The structure and coupling relationship of the coupling portion 205 will be described in more detail later with reference to FIG. 4.

The body portion 100 may include an upper protrusion 150 and a lower protrusion 170 protruding toward the housing 200. For example, the upper protrusion 150 and the lower protrusion 170 may be provided on side surfaces of the tip portion 110 and the connection portion 130, respectively. The housing 200 may include an upper opening 250 that accommodates the upper protrusion 150 and a lower opening 270 that accommodates the lower protrusion 170.

Before the tip portion 110 is in contact with a wafer chip pad, the upper protrusion 150 may be supported at an upper end of the upper opening 250 and may hold the body portion 100 not to get out of the housing 200. That is, the upper end of the upper opening 250 may serve as a stopper for the upper protrusion 150. Also, when the tip portion 110 is contact with the wafer chip pad, the spring portion 120 may be contracted by an external force and the upper protrusion 150 may move toward a lower end of the upper opening 250 along a longitudinal direction of the upper opening 250.

Further, the lower protrusion 170 may be supported at a lower end of the lower opening 270 and may suppress pushing of the body portion 100 toward a lower side of the housing 200. That is, the lower end of the lower opening 270 may serve as a stopper for the lower protrusion 170. Furthermore, when an external force is applied to the body portion 100, the lower protrusion 170 may move toward an upper end of the lower opening 270 along a longitudinal direction of the lower opening 270 to reduce a shock transferred to the connection portion 130.

As described above, the body portion 100 includes the upper protrusion 150 and the lower protrusion 170, and the upper protrusion 150 and the lower protrusion 170 are movably accommodated in the upper opening 250 and the lower opening 270, respectively, of the housing 200. Therefore, it is possible to further improve an elastic force of the body portion 100 and also possible to more effectively absorb a shock transferred from the tip portion 110.

The tip portion 110 may include a contact surface 111 provided on its upper surface. As shown in FIG. 2, the contact surface 111 of the tip portion 110 may have a shape of a plurality of triangular prisms. In this case, base sides of the plurality of triangular prisms may extend from a side surface of the tip portion 110. Herein, the base side of a triangular prism refers to a triangular base. Since the contact surface 111 has the above-described shape, the triangular prisms are to be in contact at the edges. Therefore, it is possible to suppress a decrease in contact efficiency caused by contaminants. Also, the contact surface 111 has a greater contact area than a single horn-shaped contact surface. Therefore, it is possible to reduce wear of the contact surface.

Figure 3:
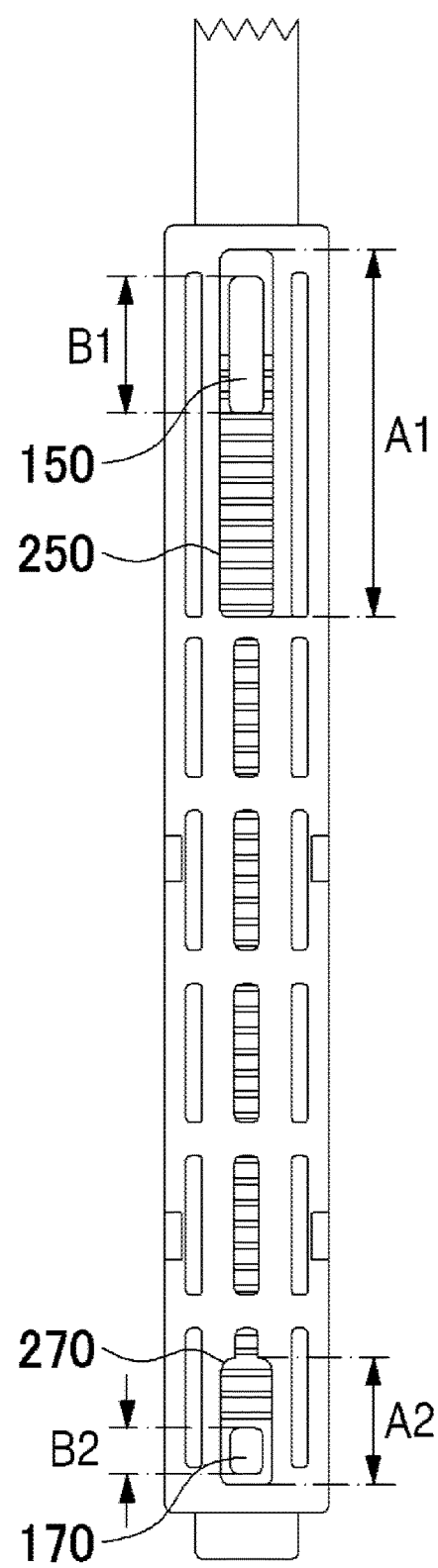
FIG. 3 is a diagram explaining a correlation between a protrusion and an opening of the probe pin according to an embodiment of the present disclosure.

FIG. 3 is a diagram explaining a correlation between a protrusion and an opening of the probe pin according to an embodiment of the present disclosure.

As shown in FIG. 3, the probe pin 10 according to an embodiment of the present disclosure may include the upper protrusion 150 provided at the tip portion 110 of the body portion 100, the upper opening 250 provided at an upper part of the housing 200, the lower protrusion 170 provided at the connection portion 130 of the body portion 100, and the lower opening 270 provided at a lower part of the housing 200. In an embodiment, the openings 250 and 270 may be formed in one surface of the housing 200 into a shape capable of accommodating the protrusions 150 and 170, respectively. In an embodiment, the openings 250 and 270 may have a quadrangular shape or an oval shape, but are not limited thereto. Further, the openings 250 and 270 may be greater in length in a longitudinal direction of the openings 250 and 270 than the protrusions 150 and 170 so that the protrusions 150 and 170 can move within the openings 250 and 270. Therefore, it is possible to check movements of the spring portion 120 through parts of the openings 250 and 270 that are not occupied by the protrusions 150 and 170.

The upper protrusion 150 may protrude toward the housing 200 and may be located to be accommodated in the upper opening 250 of the housing 200. The upper opening 250 may be provided to accommodate the upper protrusion 150 and guide vertical movements of the upper protrusion 150. In an embodiment, a length A1 of the upper opening 250 may be greater in a longitudinal direction of the probe pin 10 than a length B1 of the upper protrusion 150.

The lower protrusion 170 may protrude toward the housing 200 and may be located to be accommodated in the lower opening 270 of the housing 200. The lower opening 270 may be provided to accommodate the lower protrusion 170 and guide vertical movements of the lower protrusion 170. In an embodiment, a length A2 of the lower opening 270 may be greater in the longitudinal direction of the probe pin 10 than a length B2 of the lower protrusion 170.

Further, the length A1 of the upper opening 250 may be greater in the longitudinal direction of the probe pin 10 than the length A2 of the lower opening 270. That is, the upper protrusion 150 may have a greater moving range than the lower protrusion 170. Therefore, an upper part of the probe pin 10 to which a greater shock of external force is transferred can absorb more shock.

Figure 4:
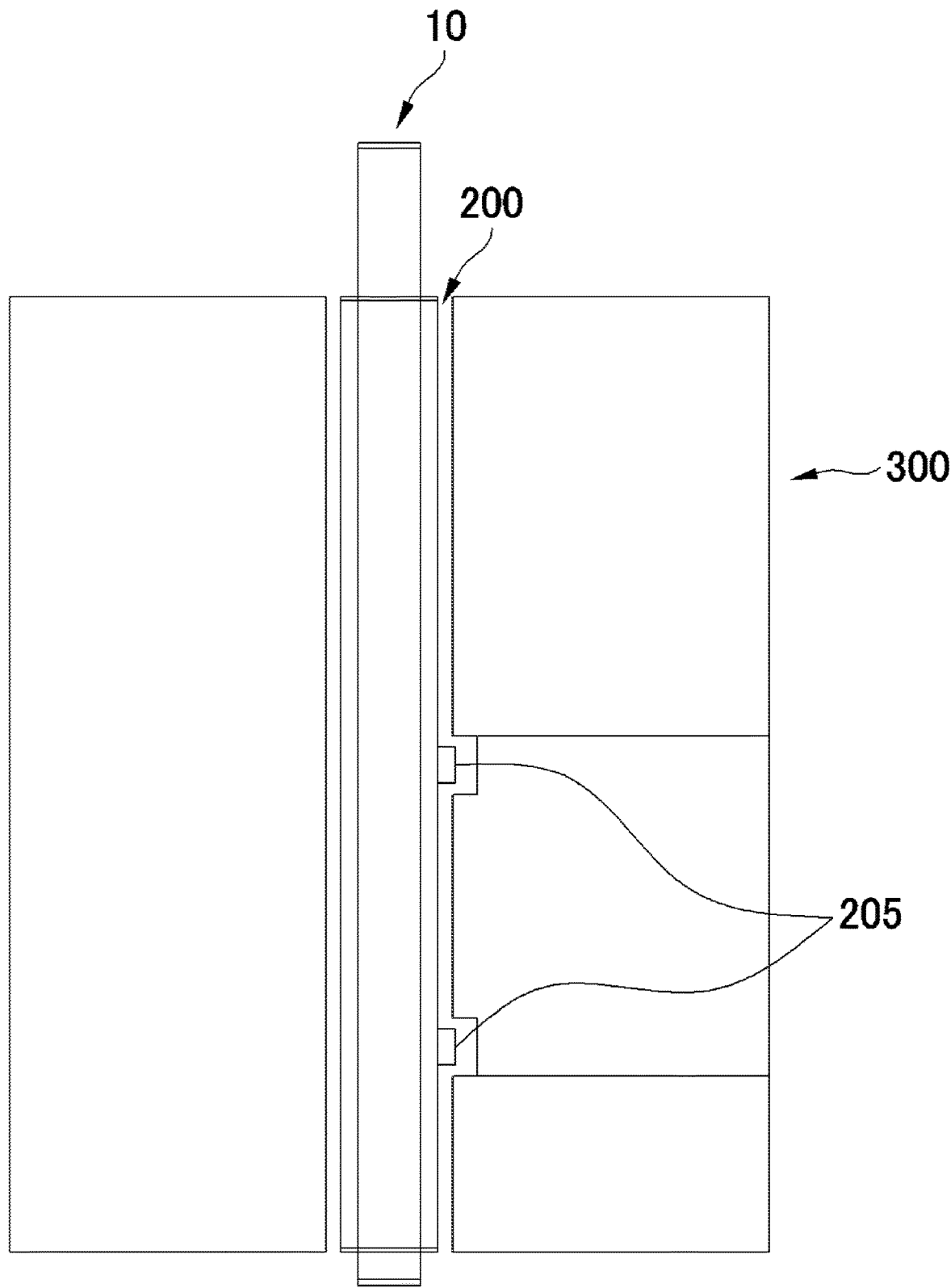
FIG. 4 is a diagram illustrating an example of the probe pin according to an embodiment of the present disclosure.

FIG. 4 is a diagram illustrating an example of the probe pin 10 according to an embodiment of the present disclosure.

As shown in FIG. 4, the probe pin 10 according to an embodiment of the present disclosure may be fixed by being inserted into a plurality of holes formed in a guide plate 300. FIG. 4 illustrates a single hole for the sake of explanation, but the guide plate 300 may include a plurality of holes at intervals corresponding to fine pitches of the wafer chip pad.

In an embodiment, the coupling portion 205 provided on an outer surface of the housing 200 may be fixed by being inserted into a coupling groove of the guide plate 300. The coupling portion 205 may protrude toward the guide plate 300 from the outer surface of the housing 200. Also, the coupling groove of the guide plate 300 may be located and formed corresponding to the coupling portion 205.

Figure 5:
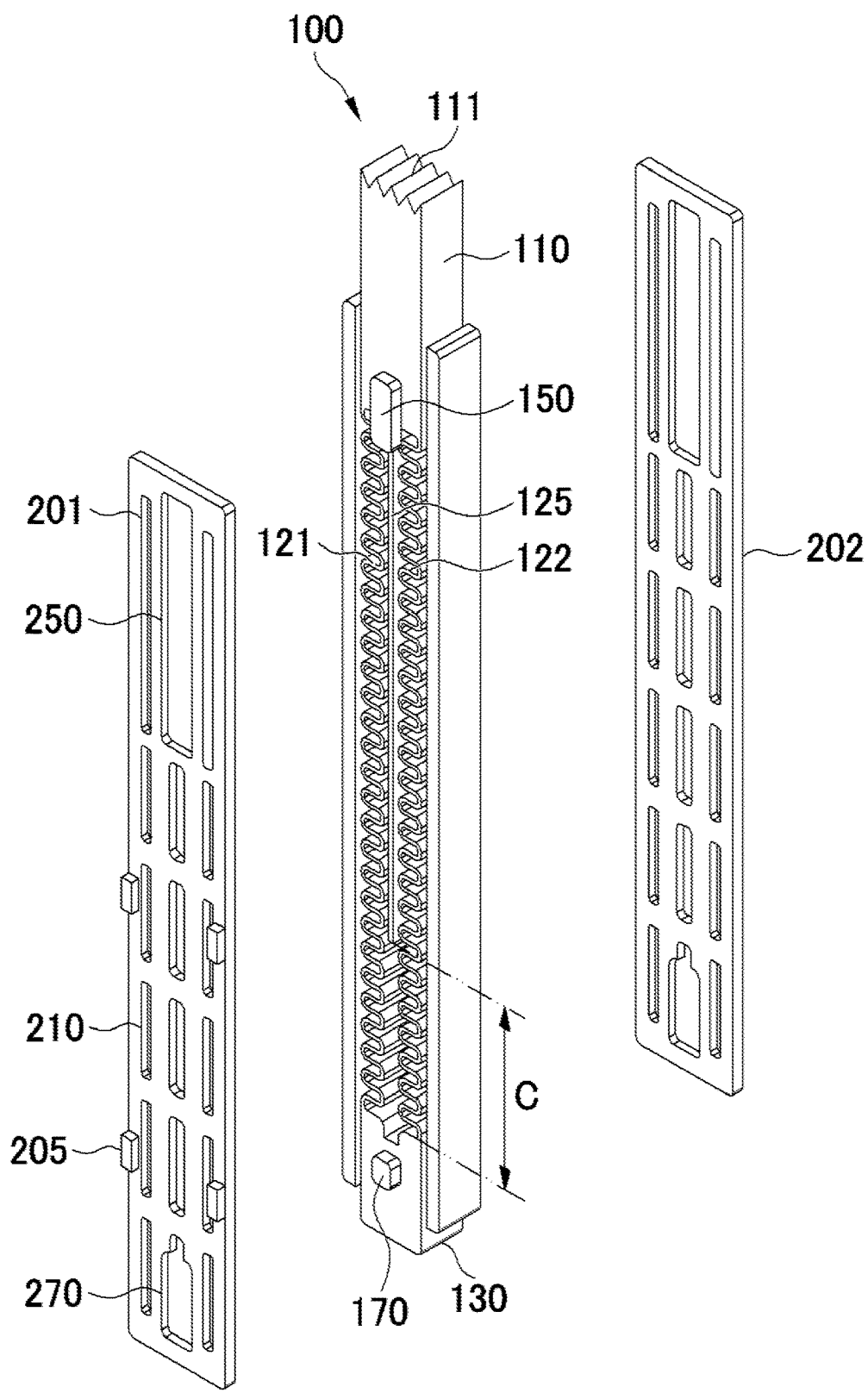
FIG. 5 is an exploded perspective view illustrating a structure of a body portion of a probe pin according to another embodiment of the present disclosure.

FIG. 5 is an exploded perspective view illustrating a structure of a body portion of a probe pin according to another embodiment of the present disclosure. As shown in FIG. 5, the probe pin according to another embodiment of the present disclosure has the same configuration as the probe pin according to an embodiment illustrated in FIG. 1 to FIG. 4 except the spring portion 120 of the body portion 100. Therefore, all the features of the embodiment illustrated in FIG. 1 to FIG. 4 except the spring portion 120 can be applied to the embodiment illustrated in FIG. 5, and, thus, a detailed description thereof will be omitted.

The spring portion 120 of the probe pin according to another embodiment of the present disclosure may include a plurality of springs. For example, as shown in FIG. 5, the spring portion 120 may include a first spring 121, a second spring 122 spaced apart from the first spring 121, and a separation wall 125 provided between the first spring 121 and the second spring 122.

The first spring 121 and the second spring 122 may extend from the tip portion 110 and supply an elastic force to the body portion 100 in the vertical direction. That is, the first spring 121 and the second spring 122 may supply an elastic force in the same direction. In an embodiment, if a lower surface of the tip portion 110 includes a first region and a second region which are different from each other, the first spring 121 may extend from the first region to the connection portion 130 and the second spring 122 may extend from the second region to the connection portion 130. Since the spring portion 120 includes a plurality of springs, even if one of the springs is defective, the probe pin can be operated by another spring. Therefore, the probe pin can be increased in life.

The separation wall 125 may be provided between the first spring 121 and the second spring 122 and may extend from the lower surface of the tip portion 110. In this case, the separation wall 125 may be smaller in length in a longitudinal direction of the probe pin than the first spring 121 or the second spring 122 before the first spring 121 or the second spring 122 is deformed, for example, before an external force is applied thereto. That is, one end of the separation wall 125 may be connected to the tip portion 110 and the other end of the separation wall 125 may be spaced apart from an upper surface of the connection portion 130. In this case, a separation distance C between the other end of the separation wall 125 and the upper surface of the connection portion 130 may be determined as a moving range of the spring portion 120. The separation wall 125 can suppress mutual interference between the first spring 121 and the second spring 122 during their movements, and electrical characteristics can be improved by contact between the springs 121 and 122 and the separation wall 125 during movements of the spring portion 120.

The above description of the present disclosure is provided for the purpose of illustration, and it would be understood by a person with ordinary skill in the art that various changes and modifications may be made without changing technical conception and essential features of the present disclosure. Thus, it is clear that the above-described embodiments are illustrative in all aspects and do not limit the present disclosure.

The scope of the present disclosure is defined by the following claims rather than by the detailed description of the embodiment. It shall be understood that all modifications and embodiments conceived from the meaning and scope of the claims and their equivalents are included in the scope of the present disclosure.

EXPLANATION OF REFERENCE NUMERALS

10: probe pin
100: body portion
110: tip portion
120: spring portion
130: connection portion
150: upper protrusion
170: lower protrusion
200: housing
210: through-slit
250: upper opening
270: lower opening

I claim:

1. A probe pin for testing a target object, comprising:
a body portion of which a lower end is connected to a substrate and extends in a vertical direction and an upper end configured to be in contact with the target object;
a housing provided to surround at least a part of the body portion and configured to support the body portion,
wherein the body portion includes:
a tip portion to be in contact with the target object;
a spring portion extending from the tip portion and supplying an elastic force to the body portion in the vertical direction,
an upper protrusion provided on a side surface of the tip portion and protruding toward the housing, and
a lower protrusion provided on a side surface of the connection portion and protruding toward the housing;
wherein the housing includes:
an upper opening that accommodates the upper protrusion, and
a lower opening that accommodates the lower protrusion;
wherein further
the upper opening is greater in length in a longitudinal direction of the probe pin than the upper protrusion,
the lower opening is greater in length in the longitudinal direction of the probe pin than the lower protrusion, and
the upper opening is greater in length than the lower opening; and
a connection portion extending from the spring portion and connected to the substrate.

2. The probe pin of claim 1, wherein the housing further includes:
a plurality of through-slits formed in at least one surface thereof.

3. The probe pin of claim 1, wherein
the tip portion includes a contact surface provided on its upper surface, and
the contact surface has a shape of a plurality of triangular prisms and base sides of the plurality of triangular prisms extend from a side surface of the tip portion.

4. The probe pin of claim 1, wherein the spring portion includes:
a first spring extending from a lower surface of the tip portion;
a second spring extending from the lower surface of the tip portion and spaced apart from the first spring; and
a separation wall provided between the first spring and the second spring.

5. The probe pin of claim 4, wherein the separation wall is smaller in length in a longitudinal direction of the probe pin than the first spring or the second spring before the first spring or the second spring is deformed.

6. The probe pin of claim 4, wherein before the first spring or the second spring is deformed, an end of the separation wall is spaced apart from an upper surface of the connection portion.

* * * * *